United States Patent
Tomita et al.

(10) Patent No.: US 9,988,738 B2
(45) Date of Patent: Jun. 5, 2018

(54) METHOD FOR MANUFACTURING SIC EPITAXIAL WAFER

(71) Applicant: Mitsubishi Electric Corporation, Chiyoda-ku (JP)

(72) Inventors: Nobuyuki Tomita, Tokyo (JP); Yoichiro Mitani, Tokyo (JP); Takanori Tanaka, Tokyo (JP); Naoyuki Kawabata, Tokyo (JP); Yoshihiko Toyoda, Tokyo (JP); Takeharu Kuroiwa, Tokyo (JP); Kenichi Hamano, Tokyo (JP); Akihito Ono, Tokyo (JP); Junji Ochi, Tokyo (JP); Zempei Kawazu, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 67 days.

(21) Appl. No.: 14/762,652

(22) PCT Filed: Dec. 26, 2013

(86) PCT No.: PCT/JP2013/007619
§ 371 (c)(1),
(2) Date: Jul. 22, 2015

(87) PCT Pub. No.: WO2014/122550
PCT Pub. Date: Aug. 21, 2014

(65) Prior Publication Data
US 2015/0354090 A1 Dec. 10, 2015

(30) Foreign Application Priority Data
Feb. 13, 2013 (JP) ................................. 2013-025800

(51) Int. Cl.
*C30B 25/20* (2006.01)
*H01L 21/02* (2006.01)
(Continued)

(52) U.S. Cl.
CPC .............. *C30B 25/20* (2013.01); *C30B 25/02* (2013.01); *C30B 25/10* (2013.01); *C30B 29/36* (2013.01);
(Continued)

(58) Field of Classification Search
CPC combination set(s) only.
See application file for complete search history.

(56) References Cited

U.S. PATENT DOCUMENTS 8,569,106 B2   10/2013   Haman et al.
2012/0280254 A1   11/2012   Muto et al.
(Continued)

FOREIGN PATENT DOCUMENTS

CN   102301043 A   12/2011
JP   2006-32655 A   2/2006
(Continued)

OTHER PUBLICATIONS

Machine translation of JP2009-218575.*
(Continued)

*Primary Examiner* — Erin F Bergner
(74) *Attorney, Agent, or Firm* — Oblon, McClelland, Maier & Neustadt, L.L.P.

(57) ABSTRACT

A method for manufacturing a SiC epitaxial wafer includes: a first step of, by supplying a Si supply gas and a C supply gas, performing a first epitaxial growth on a SiC bulk substrate with a 4H—SiC(0001) having an off-angle of less than 5° as a main surface at a first temperature of 1480° C. or higher and 1530° C. or lower; a second step of stopping the supply of the Si supply gas and the C supply gas and increasing a temperature of the SiC bulk substrate from the first temperature to a second temperature; and a third step of, by supplying the Si supply gas and the C supply gas, performing a second epitaxial growth on the SiC bulk
(Continued)

substrate having the temperature increased in the second step at the second temperature.

20 Claims, 7 Drawing Sheets

(51) Int. Cl.
  *C30B 25/10* (2006.01)
  *C30B 29/36* (2006.01)
  *C30B 25/02* (2006.01)

(52) U.S. Cl.
  CPC .... *H01L 21/0262* (2013.01); *H01L 21/02378* (2013.01); *H01L 21/02433* (2013.01); *H01L 21/02447* (2013.01); *H01L 21/02529* (2013.01); *H01L 21/02576* (2013.01)

(56) References Cited

U.S. PATENT DOCUMENTS

| | | | | |
|---|---|---|---|---|
| 2013/0126906 | A1* | 5/2013 | Tomita | C30B 25/02 257/77 |
| 2013/0217213 | A1* | 8/2013 | Aigo | C30B 25/02 438/478 |

FOREIGN PATENT DOCUMENTS

| | | | | |
|---|---|---|---|---|
| JP | 2006 228763 | | 8/2006 | |
| JP | 2007 131504 | | 5/2007 | |
| JP | 2007-284298 | * | 11/2007 | ............. C30B 29/36 |
| JP | 2007 284298 | | 11/2007 | |
| JP | 2009 218575 | | 9/2009 | |
| JP | 2011-121847 A | | 6/2011 | |
| WO | 2010 101016 | | 9/2010 | |
| WO | 2011/142074 | * | 11/2011 | ........... H01L 21/205 |
| WO | 2012/067112 | * | 5/2012 | ............. C30B 23/20 |

OTHER PUBLICATIONS

Machine translation of JP2007-284298.*
Notification of Reason(s) for Refusal dated Jun. 14, 2016 in Japanese Patent Application No. 2015-500006 (with English language translation).
Leone, S., et al., "Improved morphology for epitaxial growth on 4° off-axis 4H-SiC substrates", Journal of Crystal Growth, vol. 311, Issue 12, (2009), pp. 3265-3272.
International Search Report dated Mar. 25, 2014 in PCT/JP2013/007619 Filed Dec. 26, 2013.
International Preliminary Report on Patentability and Written Opinion with English language translation dated Aug. 18, 2015 in PCT/JP2013/007619.
Combined Chinese Office Action and Search Report dated Nov. 17, 2016 in patent application No. 201380072880.7 with partial English translation.
Office Action dated Aug. 17, 2017, in Chinese Patent Application No. 201380072880.7.

* cited by examiner

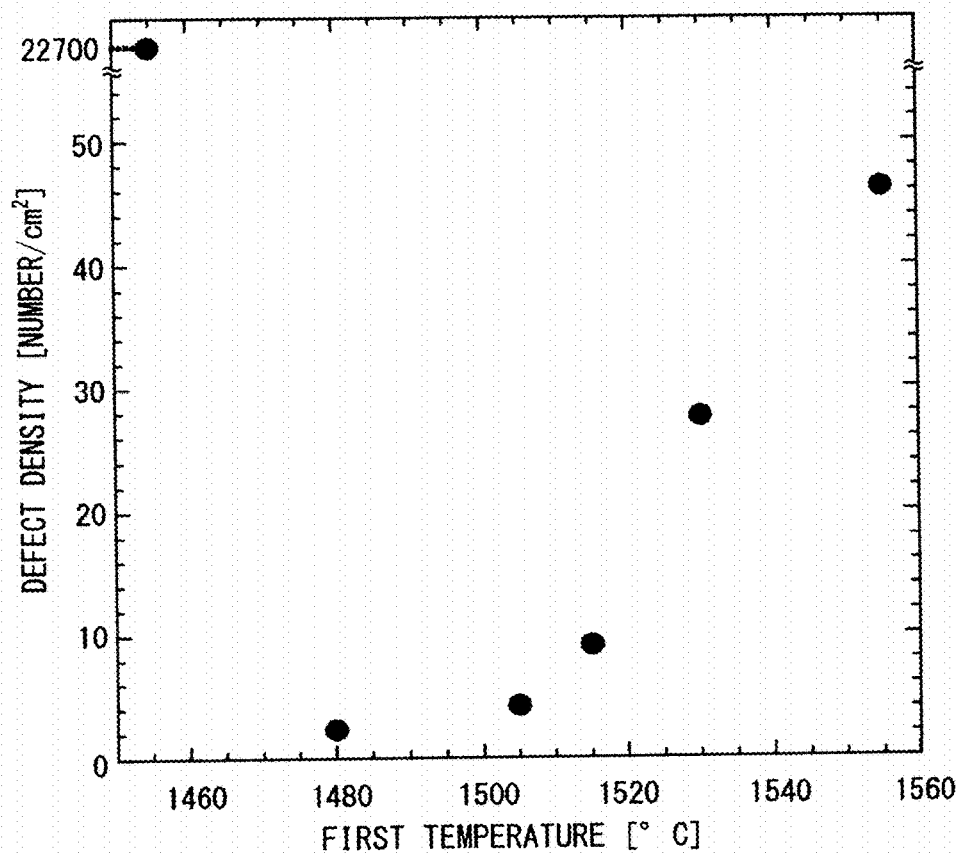
F I G. 5

F I G. 7
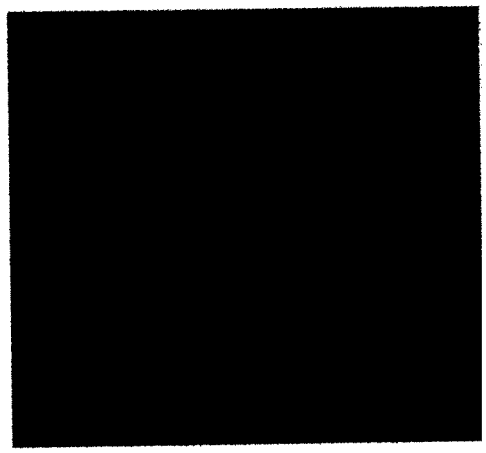

METHOD FOR MANUFACTURING SIC EPITAXIAL WAFER

TECHNICAL FIELD

The present invention relates to a method for manufacturing a silicon carbide (SiC) epitaxial wafer used in a SiC power device.

BACKGROUND ART

SiC being silicon carbide has all of a band gap, dielectric breakdown electric field strength, a saturated drift velocity, and heat conductivity relatively greater than those of silicon (Si). Thus, SiC power devices allow for significant reduction in a loss of power and for size reduction, and the SiC power devices can achieve energy conservation upon conversion of power supply and electric power, thereby attracting attention for enhanced performance of electric vehicles, enhanced functionality of solar cell systems, or the like to achieve a low-carbon society.

To manufacture the SiC power device, a SiC epitaxial layer being an active region of the device needs to be epitaxially grown on a SiC bulk substrate by a thermal chemical vapor deposition (CVD) or the like in advance. The active region herein is a cross-sectional region including a growth direction axis in which a doping density in crystals and a film thickness are precisely controlled according to desired device specifications. The SiC bulk substrate including the SiC epitaxial layer formed thereon is referred to as a silicon carbide (SiC) epitaxial wafer. The SiC power device is required to have high voltage specifications of, for example, several hundreds of V to several tens of kV, so that a film thickness of the SiC epitaxial layer needs to be thickly formed to be several μm to several hundreds of μm. Defects occurring on a surface of the SiC epitaxial layer being the active region degrade characteristics of the device, so that it is desired to reduce a defect density of the SiC epitaxial layer more than that of the SiC bulk substrate.

For the epitaxial growth of the SiC, a step-flow epitaxy in which the SiC bulk substrate having an off-angle of more than 0° is grown by the thermal CVD is typically performed. Surface defects, such as an abrasive scratch and fine irregularities, on the surface of the SiC bulk substrate are easily transferred to the SiC epitaxial layer. To suppress the transfer of the surface defects on the SiC bulk substrate, lowering a growth temperature in an early stage of the SiC epitaxial growth to slow down a growth speed is effective. However, the SiC epitaxial layer needed to have the thick film is preferably grown at a high temperature to speed up the growth speed for improving throughput in manufacturing the SiC epitaxial wafer.

Thus, a method for manufacturing a SiC epitaxial wafer by performing a first epitaxial growth at a temperature of lower than 1500° C. and then performing a second epitaxial growth at a temperature of 1500° C. or higher has been developed (for example, see Patent Document 1). The conventional method lowers the growth temperature for the purpose of suppressing a transfer of surface defects from a SiC bulk substrate in the first epitaxial growth, and increases the growth temperature for the purpose of performing the second epitaxial growth at high speed on the SiC epitaxial layer formed by the first epitaxial growth.

PRIOR ART DOCUMENT

Patent Document

Patent Document 1: Japanese Patent Application Laid-Open No. 2007-284298

SUMMARY OF INVENTION

Problems to be Solved by the Invention

Patent Document 1 discloses that a conventional silicon carbide epitaxial manufacturing method performs an epitaxial growth on a SiC bulk substrate having an off-angle specification of 8°, to thereby obtain an epitaxial wafer having a sufficient surface shape. The mainstream of an off-angle specification of the SiC bulk substrate is 4° in recent times, but a growth mechanism is different for the off-angle specification of 8° and for the off-angle specification of 4°. Thus, if a Si supply gas and a C supply gas as raw material gases continue to be supplied while a first temperature for performing a first epitaxial growth rises to a second temperature for performing a second epitaxial growth by using the SiC bulk substrate having the off-angle specification of 4°, surface defects such as step bunching degrading characteristics of a SiC device occur during the temperature rise, and the second epitaxial growth is performed on them, resulting in a problem that the surface defects such as the step bunching are formed on the surface of the SiC epitaxial wafer obtained in the end.

The present invention has been made in view of the above mentioned problems, and an object thereof is to provide a method for manufacturing a SiC epitaxial wafer capable of suppressing occurrence of surface defects such as step bunching during a temperature rise from a first temperature to a second temperature.

Means to Solve the Problems

A method for manufacturing a SiC epitaxial wafer according to the present invention includes: a first step of, by supplying a Si supply gas and a C supply gas, performing a first epitaxial growth on a SiC bulk substrate with a 4H—SiC(0001) having an off-angle of less than 5° as a main surface at a first temperature of 1480° C. or higher and 1530° C. or lower; a second step of stopping the supply of the Si supply gas and the C supply gas and increasing a temperature of the SiC bulk substrate from the first temperature to a second temperature higher than the first temperature; and a third step of, by supplying the Si supply gas and the C supply gas, performing a second epitaxial growth on the SiC bulk substrate having the temperature increased in the second step at the second temperature.

Effects of the Invention

According to this invention, when the SiC epitaxial growth is performed on the SiC bulk substrate having the off-angle of less than 5°, the first epitaxial growth is performed at the first temperature of 1480° C. or higher and 1530° C. or lower, so that the SiC epitaxial growth layer can be formed without transferring the defects of the SiC bulk substrate, and the surface defects such as the step bunching can be suppressed to occur on the SiC epitaxial growth layer formed by the first epitaxial growth because the supply of the Si supply gas and the C supply gas is stopped during the process of increasing the temperature from the first temperature to the second temperature. Furthermore, after the temperature rise, the second epitaxial growth is performed on the surface of the SiC epitaxial growth layer having the sufficient surface shape at the second temperature higher than the first temperature, so that an effect that the SiC epitaxial wafer having the sufficient surface shape can be formed at high rates of throughput is obtained.

BRIEF DESCRIPTION OF DRAWINGS

FIG. 5 is a diagram showing a dependence of a defect density on a first temperature obtained by observing a SiC epitaxial wafer obtained in this example and a comparative example by a PL-TOPO, for describing the steps of manufacturing the SiC epitaxial growth in the first embodiment of the present invention.

FIG. 7 is an AFM image in a square region with 10 μm per side obtained by the AFM observation of the surface of the SiC epitaxial wafer grown at a second temperature of 1680° C. in the method for manufacturing the SiC epitaxial growth in the first embodiment of the present invention.

DESCRIPTION OF EMBODIMENT

First Embodiment

Figure 1:
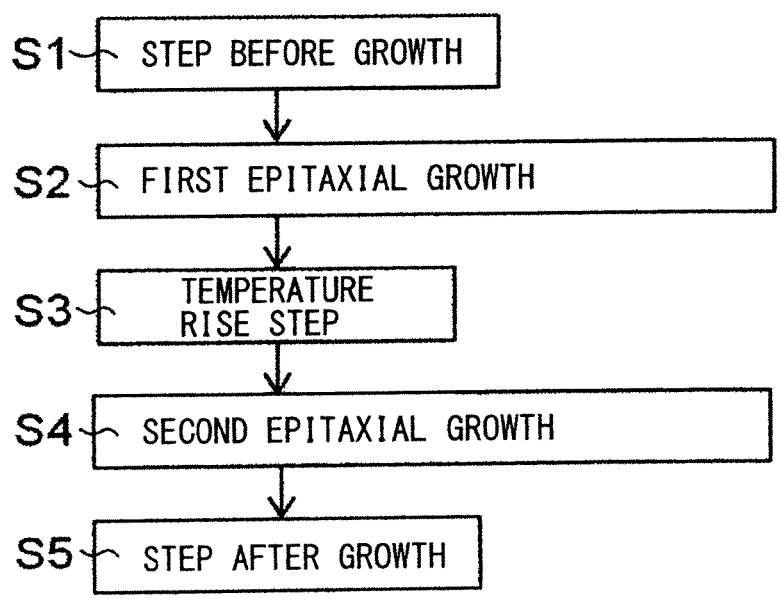
FIG. 1 is a flow diagram showing steps of manufacturing a SiC epitaxial growth in a first embodiment of the present invention.

First, steps of a silicon carbide epitaxial growth in a first embodiment of the present invention are described. FIG. 1 is a flow diagram showing the steps of the silicon carbide epitaxial growth in the first embodiment. In this embodiment, a main surface of a SiC bulk substrate is a 4H—SiC (0001) plane having an off-angle specification of 4°, and the SiC epitaxial growth is performed on it.

The off-angle specification of the SiC bulk substrate has an error of less than 1° due to an accuracy of a cut processing from a bulk. In other words, when the off-angle specification of the SiC substrate is 4°, the off-angle is actually within a range of 3° to 5°.

In Step S1 in FIG. 1, the SiC bulk substrate is set in a reactor of a CVD device, and a temperature rises to a first temperature for performing a first epitaxial growth in a gas atmosphere using a $H_2$ gas as a reducing gas. The reducing gas flows in the reactor from Step S1 to Step S5. A gas containing chlorine such as HCl may be added to the reducing gas. The first temperature is 1480° C. or higher and 1530° C. or lower as described below. It is preferably 1480° C. or higher and 1515° C. or lower.

In Step S2 in FIG. 1, raw material gases of $SiH_4$ and $C_3H_8$ are introduced into the reactor to perform the first epitaxial growth at the first temperature. For the epitaxial growth of the SiC, a growth temperature of 1480° C. or higher and 1530° C. or lower is a relatively low temperature, and a growth speed is relatively slow. In other words, in Step S2, the slow growth at the first temperature of 1480° C. or higher and 1530° C. or lower, and preferably, 1480° C. or higher and 1515° C. or lower enables the first epitaxial growth without transferring surface defects of the SiC bulk substrate, such as an abrasive scratch and fine irregularities on the surface of the SiC bulk substrate, to an epitaxial growth layer.

In Step S2 in FIG. 1, a Si supply gas and a C supply gas need to be used as the raw material gases, and a Si supply gas as, for example, $SiH_3Cl$ except for $SiH_4$ may also be used, and a C supply gas as, for example, $C_2H_4$ except for $C_3H_8$ may also be used.

In Step S2 in FIG. 1, doping gases of nitrogen, Al, B, Be, and the like may be supplied. These doping gases are supplied as necessary, so that an epitaxial growth layer of an N-type or a P-type can be formed. These doping gases may start to be introduced upon or after the start of Step S2, or may be introduced before the start of Step S2, namely, in Step S1.

After completion of the first epitaxial growth in Step S2, the temperature rises to a second temperature for performing a second epitaxial growth from the first temperature in Step S3 in FIG. 1. The supply of $SiH_4$ and $C_3H_8$ as the raw material gases flowing in Step S2 is stopped during the temperature rise in Step S3.

Step S3 increases the temperature, so that a flow rate of the raw material gases optimized for the first temperature in Step S2 is not suited during the temperature rise in Step S3. Thus, when the raw material gases flow during the temperature rise, step bunching described below is likely to occur on a surface of the SiC epitaxial layer. Particularly in a case where the off-angle is less than 5° such that the off-angle specification used in this embodiment is 4°, surface defects such as the step bunching remarkably occur due to the flow of the C supply gas such as $C_3H_8$ at an unsuitable flow rate. Thus, in this embodiment, the supply of $C_3H_8$ is stopped during the temperature rise from the first temperature to the second temperature, so that the second epitaxial growth can be performed in the next Step S4 while maintaining the surface of the epitaxial growth layer that is obtained by the first epitaxial growth and has a low number of defects.

Surface defects that occur when the Si supply gas and the C supply gas continue to be supplied during the temperature rise without using this embodiment include, for example, the step bunching and silicon droplets described below.

After completion of the temperature rise to the second temperature in Step S3, the second epitaxial growth is performed at the second temperature in Step S4 in FIG. 1. In other words, the raw material gases at the suitable flow rate for the second temperature are introduced in Step S4. The second temperature is a temperature higher than the first temperature, and the growth is performed at the temperature higher than that of the first epitaxial growth, so that a growth speed of the second epitaxial growth increases and throughput of the method for manufacturing a SiC epitaxial wafer increases.

By using this embodiment, the epitaxial layer having a sufficient surface shape is formed without transferring the surface defects of the SiC bulk substrate in the first epitaxial growth, and the supply of the raw material gases is stopped during the period of the temperature rise to the second temperature to cause the gas atmosphere in which the step bunching hardly occurs, so that the second epitaxial growth can be performed on the sufficient surface after the completion of the first epitaxial growth, and the epitaxial growth can be performed while maintaining the sufficient surface shape with the increase in the growth speed.

Also in Step S4, the doping gases of nitrogen, Al, B, Be, and the like may be supplied. These doping gases are supplied as appropriate, so that the epitaxial growth layer of the N-type or the P-type can be formed. These doping gases may start to be introduced upon or after the start of Step S4, or may be introduced before the start of Step S4, namely, in Step S3. Moreover, the doping gases supplied in Step S2 may continue to be supplied in Step S3 and Step S4.

In this manner, in the first epitaxial growth and the second epitaxial growth, the doping gases are supplied at the flow rate needed for each doping density, so that a SiC epitaxial wafer having a desired doping density can be formed.

After the second epitaxial growth forms the epitaxial layer having a desired film thickness, the supply of the raw material gases is stopped, and then the temperature is decreased to a temperature at which the SiC epitaxial wafer being formed is taken out in Step S5 in FIG. 1.

By using this embodiment, the throughput improves without transferring the surface defects of the SiC bulk substrate, and furthermore, the SiC epitaxial growth in which the occurrence of the step bunching during the temperature rise is suppressed can be performed.

A SiC device is manufactured by subjecting the SiC epitaxial wafer to various processings, so that the number of devices that have desired characteristics and are manufactured from one SiC epitaxial wafer is defined by uniformity of electrical characteristics of the SiC epitaxial growth layer. In other words, if a plane of the epitaxial wafer includes a local region having a dielectric breakdown electric field smaller than that of the other region due to surface defects or crystal defects in a growth layer or includes a local region through which a relatively great current flows upon an application of a fixed electric field, the device including the region has poor characteristics such as withstand voltage characteristics, and a so-called leak current flows due to a relatively small applied voltage.

That is to say, a factor that uniquely presets a yield of the device is crystallographic uniformity of the SiC epitaxial wafer. As substance that hampers the uniformity, so-called device-killer defects seen in an epitaxial growth layer are known.

They have common characteristics that periodicity in alignment of atoms in crystals is locally incomplete in a crystal growth direction. The device-killer defects referred to as carrot defects, comet defects, or the like, based on the characteristics of the surface shape seen from the result of the SiC epitaxial growth are known. One of causes of the defects is an abrasive scratch on the surface of the SiC bulk substrate. As a means of suppressing occurrence of the defects, this embodiment includes the first epitaxial growth performed at the first temperature of 1480° C. or higher and 1530° C. or lower.

SiC crystals have particular periodicity referred to as a polytype, which is widely known. In other words, the SiC crystals have the other type of periodicity in the alignment of the atoms along a c-axis of structure in which the SiC has stoichiometric ratio composition of Si and C in proportions of 1:1 and a crystalline lattice has a hexagonal closest packing structure. The periodicity in the atomic scale and symmetry of the crystalline lattice preset physical properties of the SiC. In terms of application to the device, what attracts the most attention now is referred to as a 4H—SiC, and the 4H—SiC is used in this embodiment.

In terms of reduction mainly in costs of raw materials, a power device using the 4H—SiC with a Si plane as a surface becomes mainstream, the Si plane being a surface that is tiled an angle of less than 5° from a (0001) plane in a <11-20> direction and includes Si atoms disposed more stable than C atoms. In other words, using the Si plane having an off-direction of the <11-20> direction and the off-angle of less than 5° as the main surface of the SiC bulk substrate becomes mainstream.

On the surface of the SiC epitaxial wafer, irregularities having a height difference of several nanometers are normally likely to appear in a linear shape vertical to the off-direction and parallel to a <1-100> direction. The irregularities being the surface shape are referred to as the step bunching. When an electrical carrier induced close to the surface of the epitaxial growth layer by an electric field or the like moves in a plane parallel to the surface in a direction that is not parallel to the step bunching, the step bunching is a direct potential barrier.

A mobility of the carrier on the SiC epitaxial wafer with the step bunching, namely, an electrical conductivity decreases, thereby degrading element characteristics. Furthermore, with the step bunching, in-plane evenness of the electrical conductivity decreases. Particularly in a case where a device of a MOS type or the like that induces the carrier close to the surface of the epitaxial growth layer includes the step bunching, forming a MOS interface on the step bunching degrades the characteristics of the device or limits flexibility in stages of designing and manufacturing a specific structure of the device.

Recessed regions that are referred to as pits due to a threading edge dislocation, a threading screw dislocation, and a dislocation combining these of a substrate and that have a depth on a submicron scale may be formed, except for the step bunching, particularly when a growth film has a great thickness of 12 μm or more. It is conceivable that the pits in the surface of the epitaxial growth layer also have an influence on the characteristics of the device.

The surface defects that cause degradation of the characteristics of the SiC power device include the device-killer defects, the step bunching, and the pits due to the dislocations as described above. The device-killer defects and the pits are the surface defects caused by transferring from the SiC bulk substrate, and the step bunching is the surface defect formed during the SiC epitaxial growth. In this embodiment, by using the procedure described in FIG. 1, the surface defects caused by transferring from the SiC bulk substrate and the step bunching can both be suppressed by Step S2 that performs the first epitaxial growth and by stopping the supply of the raw material gases in the temperature rise step being Step S3, respectively.

Next, an off-angle is described. The off-angle is defined by a tilt angle from a (0001) plane of a silicon carbide crystal in an off-direction. In this embodiment, the <11-20> direction is used as the off-direction. Needless to say, it may be a <−1-120> direction or a <1-100> direction.

To perform a step-flow epitaxy in the SiC, the off-angle is an important factor in the epitaxial growth. The step-flow epitaxy can provide information of alignment of atoms in crystals in the substrate to atoms involved in the growth.

Without the off-angle, that is to say, when the off-angle is not provided, so-called information of a polytype of a silicon carbide included in the substrate is not clearly transmitted to the atoms involved in the growth in the crystal growth on the exact (0001) plane, and if the polytype of the SiC bulk substrate is, for example, 4H, the polytype of, for example, 6H except for 4H is epitaxially grown, which fails to achieve an ideal epitaxial growth.

In other words, without the off-angle, the epitaxial growth is performed on the (0001) plane by only two-dimensional nuclear growth, so that the epitaxial growth layer in which different types of polytypes are mixed is formed.

The reason is that the polytype is defined by periodicity in a <0001> direction, and thus a growth in which the information of the <0001> direction is transmitted is difficult in the two-dimensional nuclear growth. Consequently, the SiC epitaxial wafer including the regions of the different polytypes in the epitaxial growth layer and the SiC bulk substrate is manufactured, and it is practically impossible to manufacture a device having sufficient characteristics. Therefore, to epitaxially grow the same polytype as that of the SiC bulk substrate, the presence of the off-angle is extremely important.

When the off-angle is provided, its size is also extremely important in the epitaxial growth. A so-called terrace width of the surface of the substrate, namely, a local width of the (0001) plane is theoretically defined by the size of the off-angle. Assuming that a crystal surface has the same so-called step heights, the terrace width is given by the tangent being a ratio of the off-angle to the step height.

The SiC bulk substrate having the off-angle specification of 4° is frequently used in recent times in place of a conventional SiC bulk substrate having an off-angle specification of 8°. The reason is that an effective yield usable for the bulk substrate from an ingot having a fixed length depends on the off-angle. In other words, as the off-angle is smaller, this yield further increases. To achieve reduced costs, a technology of increasing a diameter of a substrate is rapidly spreading, and a bulk substrate having a diameter of 4 inches or more is the mainstream nowadays. It can be said that as a diameter of the SiC bulk substrate increases, an effective yield to the same off-angle decreases, resulting in a factor in accelerating a trend of low off-angle.

Figure 2:
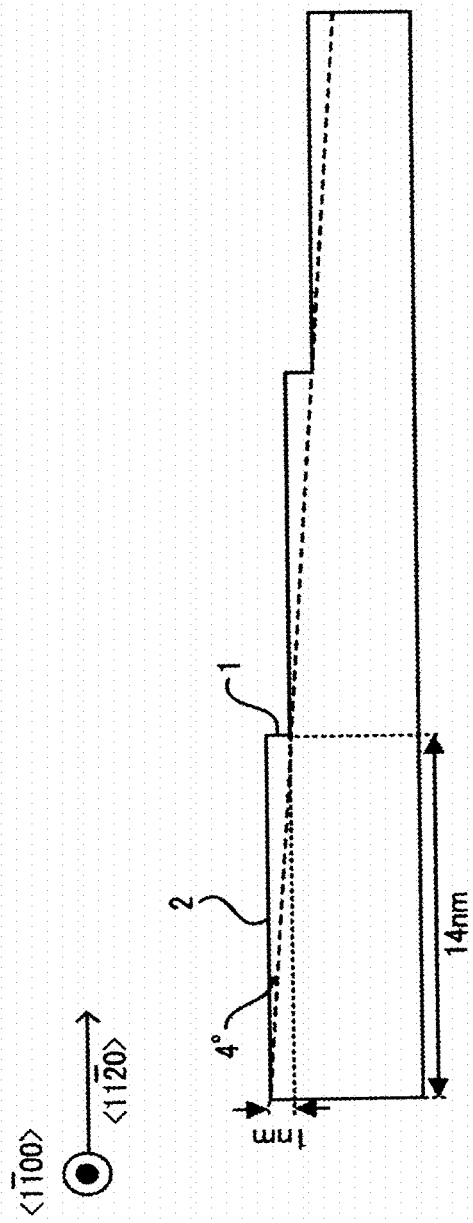
FIG. 2 is a cross-sectional view schematically showing a microscopic structure of a 4H—SiC in a case where an off-angle seen from a <1-100> direction is 4° for describing a method for manufacturing the SiC epitaxial growth in the first embodiment of the present invention.
Figure 3:
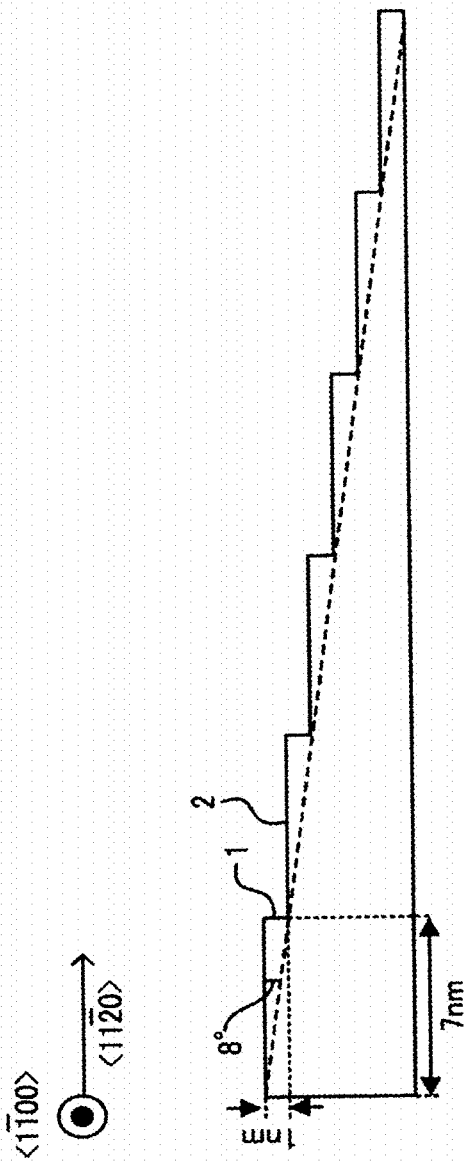
FIG. 3 is a cross-sectional view schematically showing a microscopic structure of a 4H—SiC in a case where an off-angle seen from the <1-100> direction is 8° for describing the method for manufacturing the SiC epitaxial growth in the first embodiment of the present invention.

FIGS. 2 and 3 are cross-sectional views schematically showing microscopic structures of a 4H—SiC seen from the <1-100> direction, and FIG. 2 shows an off-angle of 4°, and FIG. 3 shows an off-angle of 8°. In the 4H—SiC, one period in the <0001> direction of the crystalline lattice is 1 nm. Therefore, a step 1 of 1 nm is conceivably formed on the surface in an ideal state. On the other hand, a terrace width of a flat portion referred to as a terrace 2 is formed according to the off-angle of the substrate and is defined geometrically. The terrace width L (nm) is calculated from (1/tan θ) where the off-angle is θ, and the terrace width L (nm) is 14 nm for the off-angle of 4° and is 7 nm for the off-angle of 8°.

In this manner, for the off-angle of 4° compared to the off-angle of 8°, the terrace width is 14 nm, which is twice as much as the terrace width for the off-angle of 8°, in the ideal state. It is known that the difference in the off-angle has a great influence on the flatness being the surface shape of the epitaxial growth layer.

Specifically, for the same growth conditions, step bunching that is not seen in the epitaxial growth layer formed on the SiC bulk substrate having the off-angle specification of 8° is often seen in the epitaxial growth layer formed on the SiC bulk substrate having the off-angle specification of 4°.

It is known that the step bunching mainly and greatly depends on surface motion of bonded atoms, and a range of growth temperatures at which the step bunching does not occur on the SiC bulk substrate having the off-angle specification of 4° and having the great terrace width is narrower than on the SiC bulk substrate having the off-angle specification of 8°.

So-called crystallinity represents various physical properties defined by completeness of a structure regarding alignment of atoms, and a growth condition that obtains an epitaxial growth layer having the sufficient crystallinity including surface flatness greatly depends on an off-angle.

In the SiC epitaxial growth, raw material atoms supplied from the raw material gases are bonded to the terrace having an area relatively wider than a side surface of the step and perform motion referred to as migration while being bonded to the surface of the terrace. An idea that after the migration, the atoms are taken in the step at some probability and a crystal growth proceeds is a step-flow epitaxy.

An actual process of the crystal growth conceivably depends on various phenomena or conditions such as decomposition of a raw material molecule and re-evaporation from the crystal surface in addition to the step-flow epitaxy, and an extremely complicated physicochemical process proceeds at the same time.

The step bunching as the phenomenon that degrades the surface shape of the SiC epitaxial growth layer is described. The step bunching causes the terrace width to become uneven as the growth proceeds and also causes steps to gather, resulting in a step height is 1 nm or more in the <0001> direction.

Figure 4:
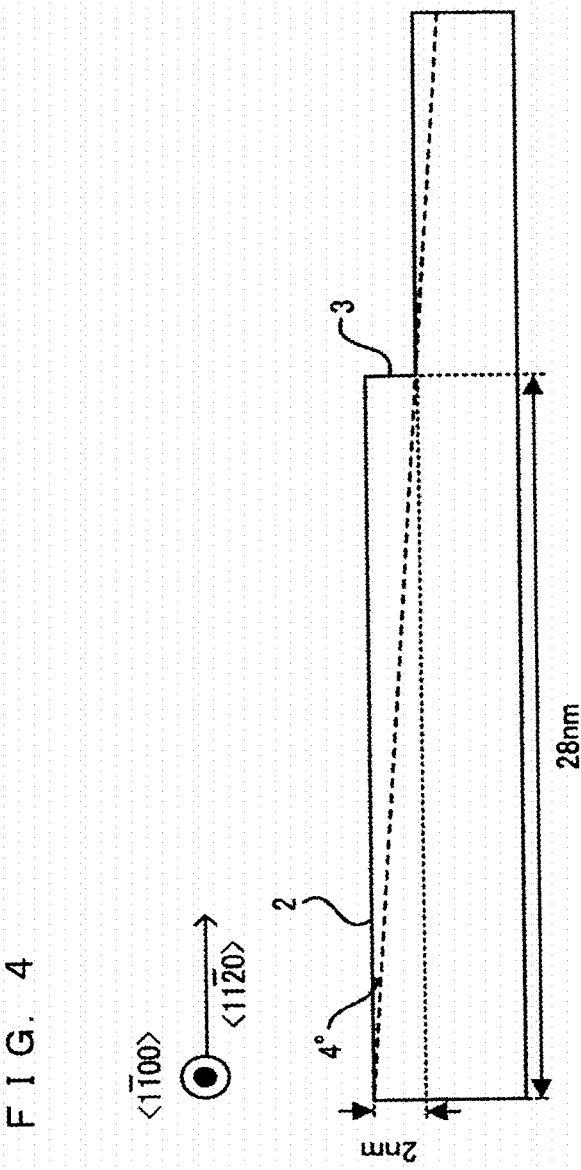
FIG. 4 is a schematic cross-sectional view showing an example of step bunching seen from the <1-100> direction for describing the method for manufacturing the SiC epitaxial growth in the first embodiment of the present invention.

FIG. 4 is a schematic cross-sectional view seen from the <1-100> direction for showing an example of the step bunching. The steps gather to form one step bunching, which is referred to as a bunching step 3. A step height of the bunching step 3 increases, which is an effective potential barrier for a carrier flowing in a direction vertical to the step, so that a mobility decreases and a device resistance increases. Thus, the step bunching needs to be suppressed.

As described above, it is known that the growth condition that does not cause the step bunching and obtains a flat surface is more limited when the off-angle specification of the SiC bulk substrate is 4° than when the off-angle specification is 8°. As described above, the step bunching results from the epitaxial growth being the complicated physicochemical process.

However, it can be simply described as follows. The raw material atoms migrate on the terrace and are taken in the step, achieving the step-flow epitaxy. When the raw material atoms bonded to the surface of the terrace are taken in the step by the migration on the terrace, it can be said that the raw material atoms are more easily taken in the step as they are closer to the step (step height). When the raw material atoms migrate on the terrace, the large terrace width reduces a probability that the raw material atoms pass a position of the terrace close to the step. Thus, the raw material atoms are more hardly taken in the step on the SiC bulk substrate having the off-angle specification of 4° and having the large terrace width than on the SiC bulk substrate having the off-angle specification of 8°.

Furthermore, the atoms migrating on the terrace until the atoms are taken in the step are easily etched with the reducing gas during the growth. As a result, it can be said that the progression of the growth by the step-flow epitaxy and the etching with the reducing gas are poorly balanced. In other words, the epitaxial layer is grown while maintaining the optimum balance between the bonding of the raw material atoms to the terrace by the supply of the raw material gases and the separation (etching) of the raw material atoms on the terrace by the reducing gas. For lack of etching, the raw material atoms are excessively bonded, and for excessive etching, the raw material atoms needed to be taken in as an epitaxial layer are etched. The SiC bulk substrate having the off-angle specification of 4° has the terrace width larger than that of the SiC bulk substrate having the off-angle specification of 8°, so that the raw material atoms migrate on the terrace for a longer time, thereby easily causing excessive etching. As a result, the epitaxial growth layer having the uniform terrace width cannot be formed, and the step bunching easily occurs.

For the reasons described above, when the off-angle specification is 4° compared to 8°, the uniform terrace width is hardly formed and the sufficient step-flow epitaxy is hardly performed, thereby conceivably limiting the growth condition in which the step bunching occurs. Thus, when the off-angle is less than 5° such that the off-angle specification is 4°, upon the temperature rise from the first temperature to the second temperature, the raw material gases continue to flow at the flow rate, which is not optimized for each temperature changing during the temperature rise, thereby losing the balance between the bonding and the separation of the raw material atoms and easily causing the step bunching to occur.

Therefore, in Step S3 being the temperature rise step between the first temperature and the second temperature in this embodiment, the supply of the Si supply gas and the C supply gas as the raw material gases needs to be stopped. The temperature rises in the state where the introduction of the raw material gases is stopped, and thus the occurrence of the step bunching caused by the growth in the unsuitable condition for each of the temperatures can be suppressed during the temperature rise between the first temperature and the second temperature.

Furthermore, for the off-angle specification of 4°, it is known that the introduction of $C_3H_8$ accelerates the occurrence of the step bunching.

For the off-angle specification of 8°, it is said that at least the continuous supply of $C_3H_8$ being the C supply gas is needed for preventing carbon atoms to be separated from the surface of the epitaxial growth layer. Thus, for the off-angle specification of 8°, the supply of $C_3H_8$ preferably continues also during the period of the temperature rise. However, for the off-angle specification of 4°, Step S3 in which the temperature rises from the first temperature to the second temperature is performed, for example, while only the Si supply gas is stopped and the supply of $C_3H_8$ continues, resulting in a problem that the step bunching easily occurs in a short time. Furthermore, when only the C supply gas is stopped and only the Si supply gas continues to be supplied during the temperature rise, the surface defects such as silicon droplets described below occur.

Therefore, in Step S3, to increase the temperature while maintaining the surface having sufficient flatness, the raw material gases need to be stopped and only the $H_2$ gas as the reducing gas continues to be supplied during the temperature rise. This is a characteristic matter, which is remarkably seen when the off-angle is less than 5°, and specifically, the off-angle specification is 4°, and which is not seen when the off-angle specification is 8°.

In other words, in this embodiment, after the completion of the first epitaxial growth, only the $H_2$ gas is supplied and the temperature rises from the first temperature to the second temperature in Step S4, and then after reaching the second temperature, $SiH_4$ and $C_3H_8$ start to be supplied at the same time, which is extremely important to obtain the epitaxial growth layer having the sufficient surface shape in which the surface defects such as the step bunching are not formed.

In addition, during the temperature rise in Step S3, the HCl gas or the doping gases except for the raw material gases as described above may be supplied other than $H_2$ being the reducing gas.

In this manner, to suppress the step bunching, the growth condition differs according to the off-angle of the SiC bulk substrate, as described above, and it is also important to suppress formation of the device-killer defects caused by the pits due to the dislocations or the like and caused by the abrasive scratch on the SiC bulk substrate. The SiC epitaxial growth is a process that undergoes adsorption of the raw material gases and migration successively on the surface, so that a condition for not transferring the surface defects of the SiC bulk substrate is different for the off-angle specification of 8° and for the off-angle specification of 4°.

In this embodiment, as described below, performing the first epitaxial growth at the first temperature of 1480° C. or higher and 1530° C. or lower can suppress the transfer of the surface defects of the SiC bulk substrate having the off-angle specification of 4° and can form the epitaxial layer having the sufficient surface shape. The first temperature is preferably 1480° C. or higher and 1515° C. or lower.

Next, crystal defects except for the surface defects of the SiC epitaxial layer are described. The crystal defects are broadly divided into point defects, line defects, and plane defects. These defects as well as a relationship between the crystal defects and the surface defects are described below.

First, the point defects are described. The 4H—SiC has a band gap greater than that of aluminum gallium indium arsenide phosphide (AlGaInAsP) system on a substrate of gallium arsenide (GaAs) and indium phosphide (InP). Therefore, the point defects formed of vacancies, interstitial atoms, interstitial substitutional atoms, and impurities form a level having a higher energy from a band edge than that of conventional semiconductors. In other words, the point defects form a trap at a deep level.

These point defects are hardly formed when a growth temperature is high. A growth temperature of the SiC is several hundreds of ° C. higher than that of the conventional semiconductor, so that it is known that a probability of formation of the point defects is low.

Next, the line defects are described. A threading edge dislocation, a threading screw dislocation, and a dislocation combining these are usually in the 4H—SiC. Among these, the threading screw dislocation having a great Burgers vector that indicates a crystallographic size of a dislocation is a typical device-killer defect referred to as a micropipe, but its density is extremely low nowadays with the progression of the SiC bulk crystal growth technology, so that this problem is becoming less serious under present circumstances.

The threading edge dislocation and the threading screw dislocation having a small Burgers vector in the SiC bulk substrate are transferred as they are also in the epitaxial growth, and lowering the density is difficult at this stage. Furthermore, these line defects may sometimes form small regions referred to as pits in the surface of the epitaxial layer, the pits being recesses or projections in which difference of altitude usually exceeds 10 nm. Particularly in a case where the difference of altitude is, for example, on a submicron scale, they may be effective device-killer defects.

Next, the plane defects are described. The plane defects are usually in the form of laminated defects that are locally distributed in the plane of the SiC epitaxial wafer in the 4H—SiC. The typical device-killer defects after the epitaxial growth, such as carrot defects, comet defects, triangular defects, and basal plane dislocations being the surface defects, implicate all the laminated defects. Conversely, the plane defects including the laminated defects may be conceivably the device-killer defects.

Moreover, an effective band gap is different between a laminated defect and a region except for that. In addition, its area is theoretically wider. Thus, a so-called photoluminescence topography (PL-TOPO) that uniformly excites a millimeter-scale region with a specific excitation wavelength and observes the light-emitting region through an optical filter can evaluate the laminated defects almost nondestructively, so that the PL-TOPO is effective.

As described so far, the defects in the 4H—SiC are broadly divided into the surface defects and the crystal defects. The surface defects include the step bunching appearing on the surface during the epitaxial growth, the device-killer defects such as the carrot defects, and the pits in the surface caused by the line defects among the crystal defects. The crystal defects include the plane defects including the laminated defects that cause the device-killer defects, the point defects being the traps at the deep level, and the line defects causing the pits in the surface.

To evaluate the crystallinity, observing physical irregularities on the surface by an optical microscope or an atomic force microscope and observing the laminated defects by the PL-TOPO are effective. In an example of this embodiment, which is described below, a defect density is defined by an abnormal light-emitting region observed by the PL-TOPO. An atomic force microscopy (AFM) evaluation determines the presence or absence of the step bunching.

Example

The example of an epitaxial growth using the first embodiment and a comparative example are described.

First, in Step S1 as shown in FIG. 1, a planarization process was performed on a 4-inch SiC bulk substrate being a 4H—SiC by chemical-mechanical polishing using mechanical polishing and an acidic chemical solution or an alkaline chemical solution. The SiC bulk substrate had a Si plane having an off-direction of a <11-20> direction and an off-angle specification of 4° as a main surface.

Moreover, organic matter was removed by ultrasonic cleaning using acetone. Next, so-called RCA cleaning was performed on this substrate. In other words, the SiC bulk substrate was immersed for 10 minutes in a mixed solution of aqueous ammonia and aqueous hydrogen peroxide (1:9) heated at 75° C. (±5° C.) and then immersed in hydrochloric acid and aqueous hydrogen peroxide (1:9) heated at 75° C. (5° C.). Further, after immersion in an aqueous solution containing hydrofluoric acid of approximately 5% by volume, a surface of the SiC bulk substrate was cleaned by a replacement process with pure water.

Next, the SiC substrate was set in a reactor of a CVD device being an epitaxial growth device, which was evacuated to approximately $1 \times 10^{-7}$ kPa.

Next, a temperature was increased to a first temperature in an atmosphere of a reducing gas. Here, five conditions were 1455° C., 1480° C., 1505° C., 1530° C., and 1555° C. Among these, the first temperature of the example using this embodiment was 1480° C., 1505° C., and 1530° C., and the first temperature of the comparative example was 1455° C. and 1555° C.

A $H_2$ gas was used as the reducing gas, and the gas containing chlorine such as HCl, as described above, may be added to the reducing gas.

After completion of the temperature rise to the first temperature, in Step S2 in FIG. 1, raw material gases were introduced to start a first epitaxial growth. A suitable flow rate of the raw material gases was determined by a structure of the reactor or pressure and was greatly changed by a growth speed, so that it cannot be preset definitely, but in the CVD device used in this example, $SiH_4$ as a Si supply gas was 120 sccm and $C_3H_8$ as a C supply gas was 50 sccm, and the first epitaxial growth was performed by starting to supply the reactor with $SiH_4$ and $C_3H_8$ at the same time.

In this example, a $N_2$ gas as a doping gas was introduced to perform an N-type doping.

Herein, an organic metal material containing Al, B, and Be may be supplied for a P-type doping as necessary.

Further, to speed up the growth, the reducing gas to which the gas containing chlorine was added may be used together.

A growth film had a thickness of 300 nm. The growth speed of the first epitaxial growth hardly depended on the first temperature of the above-mentioned five conditions and was approximately 1.5 µm/h.

At the time point when the epitaxial growth layer of 300 nm was formed in the first epitaxial growth, after the supply of $SiH_4$ and $C_3H_8$ being the raw material gases were stopped, the process proceeded to Step S3 in FIG. 1, and the temperature of the SiC bulk substrate was increased from the first temperature to a second temperature. The second temperature in this example was 1655° C.

After the temperature of the SiC bulk substrate reached 1655° C. as the second temperature, the process proceeded to Step S4 in FIG. 1, and a $SiH_4$ gas at a flow rate of 890 sccm and a $C_3H_8$ gas at a flow rate of 390 sccm were introduced at the same time to perform a second epitaxial growth.

Here, the flow rates of $SiH_4$ and $C_3H_8$ as the raw material gases were optimum flow rates that obtained a growth speed of 9 µm/h at a temperature of 1655° C. as the second temperature in the CVD device used in this example. For the second epitaxial growth, the second growth temperature was high such that the growth speed was 9 µm/h in consideration of productivity.

After the high-speed growth was performed by the high-temperature growth in Step S4, the temperature was decreased to a temperature at which the SiC epitaxial wafer was taken out in Step S5 in FIG. 1.

Step 1 to Step 5 were similarly performed in the comparative example to this example except for the first temperature.

FIG. 5 shows a dependence of a defect density on the first temperature obtained by observing the SiC epitaxial wafer obtained in the example and the comparative example by a PL-TOPO.

It turned out that the SiC epitaxial wafer at the first temperature of 1455° C. had a poor surface shape at a level that irregularities can be observed by an optical microscope and a normal epitaxial growth was not performed. To determine a cause of the abnormal occurrence of the irregularities on the surface, this test sample was evaluated by an AFM.

Figure 6:
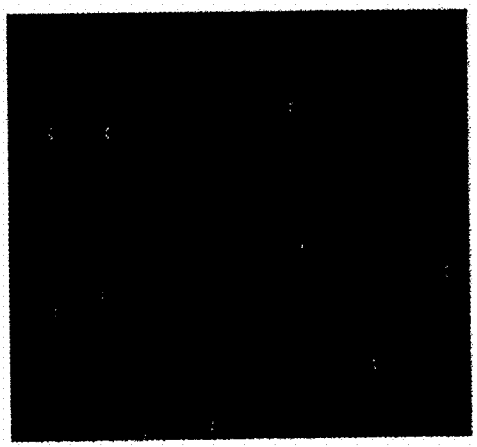
FIG. 6 is an AFM image in a square region with 200 μm per side obtained by an AFM observation of a surface of the SiC epitaxial wafer grown at a first temperature of 1455° C., as the comparative example of the example using the first embodiment of the present invention.

FIG. 6 is an AFM image in a square region with 200 µm per side obtained from a result of an AFM observation of the surface of the SiC epitaxial growth layer on which the epitaxial growth was performed at the first temperature of 1455° C. As clearly seen from this diagram, positions shown by arrows in this image are recessed regions, and the number of recessed regions is ten in the square region with 200 µM per side. The recessed regions are the actual state of the abnormal growth, and they are the recessed regions instead of projecting regions, so that it strongly suggests that abnormal growth nuclei, which do not grow, are bonded in an early stage of the growth.

Thus, the reason of the occurrence of such abnormal growth nuclei in a high density at the first temperature of 1455° C. conceivably results from insufficient decomposition of the SiH$_4$ gas close to the surface of the SiC bulk substrate, thereby forming so-called silicon droplets, which are bonded.

As clearly seen from FIG. 5, a defect density is approximately 1/cm$^2$, which is the lowest, at a first layer growth temperature of 1480° C., and a defect density tends to increase with the increase in the first temperature in the region where the first layer growth temperature is higher than 1480° C.

As clearly seen from FIG. 5, a defect density is approximately 9/cm$^2$ for the first temperature of 1515° C. and a defect density is 28/cm$^2$ for the first temperature of 1530° C.

In a method of performing a first epitaxial growth on the conventional SiC bulk substrate having the off-angle specification of 8° at a first temperature of lower than 1500° C. at a growth speed of 1 μm/h or slower and then performing a second epitaxial growth at a second temperature of 1500° C. or higher at a growth speed of 3 μm/h or faster, it is reported that a surface defect density is 30/cm$^2$ or less observed by the optical microscope.

On the other hand, the SiC epitaxial wafer in this embodiment is evaluated by the PL-TOPO, so that defects that cannot be observed by the optical microscope in the crystals are detected. Meanwhile, only defects that occur on the surface are detected by the optical microscope. As a result of evaluating, by the optical microscope, the SiC epitaxial wafer grown at the first temperature of 1530° C. by using this embodiment, the surface defects include triangular defects, downfalls (fallen objects), carrot defects, or the like, and a density of the surface defects that are likely to cause critical damage to characteristics of the device is 3/cm$^2$ or less. In other words, if the first temperature is 1480° C. or higher and 1530° C. or lower by using this embodiment, the surface defect density by the evaluation by the optical microscope is 30/cm$^2$ or less, so that the SiC epitaxial wafer having the surface defect density sufficiently lower than that of the SiC epitaxial wafer by the conventional manufacturing method is obtained. In addition, if the first temperature is 1480° C. or higher and 1515° C. or lower, the surface defect density can be more reduced to 10/cm$^2$ or less.

Furthermore, the defect density detected by the PL-TOPO by using this embodiment is 28/cm$^2$ or less while including the defects in the crystals that are known to be more than the defects observed by the optical microscope, and thus the SiC epitaxial wafer of high quality having the low defect density was obtained.

It was confirmed by this example that for the first temperature of 1480° C. or higher and 1530° C. or lower, a total of the surface defects that have an influence on the characteristics of the device and the crystal defects can be less than 28/cm$^2$.

The defect density of the SiC bulk substrate is 300/cm$^2$ or more, and the defects of the SiC bulk substrate can be sufficiently reduced in this example, and thus it can be said that an yield of the SiC power device can be sufficiently improved.

As described above, for the off-angle of less than 5°, it turned out that if the first temperature was 1480° C. or higher and 1530° C. or lower, and preferably, 1480° C. or higher and 1515° C. or lower, the transfer of the surface defects of the SiC bulk substrate was suppressed and the SiC epitaxial wafer of high quality having the low defect density was obtained. The growth gas is not sufficiently decomposed at lower than 1480° C., for example, 1455° C., which forms the silicon droplets, and thus it is not conceivable that the epitaxial growth is performed normally. For the off-angle of less than 5°, the surface defects of the SiC bulk substrate are easily transferred at a temperature higher than 1530° C., and it is not conceivable that an ideal epitaxial growth occurs in terms of completeness of crystals for the purpose of application to the device.

It is confirmed that the surface of the SiC epitaxial wafer grown by using this embodiment at the first temperature of 1480° C. or higher and 1530° C. or lower has the excellent surface flatness without the step bunching as described below.

Next, the first temperature was 1505° C. and the conditions were changed to three conditions that the second temperature was 1630° C., 1655° C., and 1680° C. to manufacture a similar SiC epitaxial wafer, and then a dependence of a surface of the SiC epitaxial wafer on the second temperature was determined.

As a result of observing the SiC epitaxial wafer after growth by the PL-TOPO, a defect density was 5/cm$^2$ or less.

In addition, when thicknesses of a growth film in a first epitaxial growth were assumed to be 1 μm, 2 μm, 5 μm, and 10 μm, defect densities of the SiC epitaxial wafer after the growth were each 5/cm$^2$ or less.

FIG. 7 is an AFM image in a square region with 10 μm per side obtained by the AFM observation of the surface of the SiC epitaxial wafer grown at the second temperature of 1680° C. Noticeable irregularities are not seen in a surface shape of an epitaxial layer, and it is clear that sufficient flatness having Ra of 0.3 nm or less is obtained. For Ra of 0.3 nm or less by the AFM observation, it is experimentally confirmed that no step bunching occurs, and it can also be said from FIG. 7 obtained by this example that there is no step bunching. The sufficient flatness is similar at 1630° C. and 1655° C.

In addition, the growth speed of the second epitaxial growth in this example was approximately 9 μm/h, but as a result of various experiments that were diligently and repeatedly performed so far, the defect density did not depend on the growth speed in the second epitaxial growth, and it was confirmed that the defect density did not change between approximately 9 μm/h and 80 μm/h being a limit of the device.

In this manner, the second epitaxial growth can speed up, and an improvement in throughput can be achieved.

Furthermore, the second temperature for performing the second epitaxial growth is a temperature higher than the first temperature, and a density of point defects occurring in the SiC epitaxial growth layer can be reduced more with a higher growth condition, so that an effect of reducing the density of the point defects is also obtained by performing the second epitaxial growth.

In other words, the second temperature is 1630° C. or higher as shown in this example, and thus the SiC epitaxial wafer having the low density of the point defects can be formed at the high speed of approximately 9 μm/h or faster.

Before using this embodiment, in a case where a buffer layer was formed on the SiC bulk substrate on which the first epitaxial growth at the first temperature of 1505° C. was performed and the second epitaxial growth was performed at the second temperature higher than the first temperature, the SiC epitaxial wafer of high quality having a defect density of 5/cm$^2$ or less and sufficient surface flatness with Ra of 0.3 nm or less could be obtained. In other words, this embodiment is applicable when being performed on the buffer layer on the SiC bulk substrate.

As described above, by using this embodiment, the SiC epitaxial wafer having the low defect density can be manufactured without transferring the surface defects of the SiC bulk substrate.

According to this embodiment, when the SiC epitaxial growth is performed on the SiC bulk substrate having the off-angle of less than 5°, the first epitaxial growth is performed at the first temperature of 1480° C. or higher and 1530° C. or lower, and preferably, 1480° C. or higher and 1515° C. or lower, so that the SiC epitaxial growth layer can be formed without transferring the defects of the SiC bulk substrate.

Moreover, according to this embodiment, upon the process of increasing a temperature from the first temperature to the second temperature, the Si supply gas and the C supply gas are stopped during the period of the temperature rise, so that the occurrence of the surface defects such as the step bunching can be suppressed even in a case where the off-angle is less than 5° in a situation where the surface defects such as the step bunching easily occur in the SiC epitaxial growth layer that is formed by the first epitaxial growth without transferring the surface defects of the SiC bulk substrate and that has the sufficient surface shape.

Furthermore, according to this embodiment, the second epitaxial growth is performed on the surface of the SiC epitaxial growth layer having the sufficient surface shape at the second temperature higher than the first temperature, so that an effect that the SiC epitaxial wafer having the sufficient surface shape can be formed at high rates of throughput is obtained.

In this embodiment, the first temperature is 1480° C. or higher and 1530° C. or lower and the first epitaxial growth is performed in a range of temperatures that make the defects of the substrate the hardest to be transferred, so that the SiC epitaxial wafer having the low defect density of 30/cm² or less can be manufactured. When the first temperature is preferably 1480° C. or higher and 1515° C. or lower, the SiC epitaxial wafer having the lower defect density of 10/cm² or less can be manufactured.

According to this embodiment, the second epitaxial growth is performed at the second temperature higher than the first temperature, so that the SiC epitaxial wafer having the reduced point defects can be manufactured.

In this embodiment, the main surface of the SiC bulk substrate is the Si plane, but it may be a C plane.

The example using this embodiment uses the SiC bulk substrate having the off-angle specification of 4°, which results from the use of the SiC bulk substrate actually having the off-angle within the range of 3° to 5° because the accuracy of the cut processing from the bulk is less than 1°.

Furthermore, the example using this embodiment uses the SiC bulk substrate having the off-angle specification of 4°, but for a SiC bulk substrate having an off-angle specification less than 4°, a step 1 has a larger terrace width. Thus, the larger terrace width causes the surface defects such as the step bunching more easily than when the off-angle specification is 4°, so that the effect of stopping the supply of the raw material gases during the temperature rise to suppress the occurrence of the step bunching is obtained by using this embodiment.

In other words, the effects of this embodiment are obtained for the off-angle of more than 0° and less than 5°.

While the embodiment has been shown and described in detail using the example, the foregoing description of the example illustrates applicable aspects of this embodiment, and this embodiment is not restricted to the example. In other words, the numerous modifications and variations of the above-mentioned aspects can be devised without departing the scope of the invention.

DESCRIPTION OF NUMERALS

1 step; 2 terrace; 3 bunching step.

The invention claimed is:

1. A method for manufacturing a SiC epitaxial wafer, comprising:
   (i) performing a first epitaxial growth on a SiC bulk substrate with a 4H—SiC(0001) plane having an off-angle of less than 5° as a main surface at a first temperature of 1480° C. or higher and 1530° C. or lower, by contacting the SiC bulk substrate with a Si supply gas and a C supply gas;
   (ii) stop contacting the SiC bulk substrate with the Si supply gas and the C supply gas, during a period of increasing a temperature of the SiC bulk substrate from the first temperature to a second temperature higher than the first temperature; and
   (iii) after the second temperature is reached, performing a second epitaxial growth on the SiC bulk substrate at the second temperature, by contacting the SiC bulk substrate with the Si supply gas and the C supply gas.

2. The method according to claim 1, wherein the increasing of the temperature in (ii) is performed in an atmosphere of a reducing gas.

3. The method according to claim 1, wherein the increasing of the temperature in (ii) is performed in an atmosphere of a reducing gas to which a chlorine gas is added.

4. The method according to claim 1, wherein the second temperature is 1630° C. or higher.

5. The method according to claim 1, further comprising contacting the SiC bulk substrate with an N-type doping gas in (i).

6. The method according to claim 1, further comprising contacting the SiC bulk substrate with an N-type doping gas in (iii).

7. The method according to claim 1, further comprising contacting the SiC bulk substrate with a reducing gas during the performing (i), the stopping (ii) and the performing (iii).

8. The method according to claim 7, wherein the reducing gas comprises $H_2$.

9. The method according to claim 8, wherein the reducing gas further comprises HCl.

10. The method according to claim 1, wherein the Si supply gas is selected from the group consisting of $SiH_3Cl$ and $SiH_4$.

11. The method according to claim 1, wherein the C supply gas is selected from the group consisting of $C_2H_4$ and $C_3H_8$.

12. The method according to claim 1, wherein the Si supply gas is $SiH_4$ and the C supply gas is $C_3H_8$.

13. The method according to claim 1, further comprising contacting the SiC bulk substrate with a P-type dopant containing at least one selected from the group consisting of Al, B and Be.

14. The method according to claim 1, wherein the performing (i) forms a first SiC epitaxial growth layer having a density of defects of less than 30/cm² by optical microscopy.

15. The method according to claim 1, wherein the performing (i) forms a first SiC epitaxial growth layer having a density of defects of 28/cm² or less by PL-TOPO.

16. The method according to claim 1, wherein during the performing (i) the first temperature is 1,505° C. or higher and 1,515° C. or lower.

17. The method according to claim 1, wherein during the performing (i) the first temperature is 1,505° C. or higher and 1530° C. or lower.

18. The method according to claim 1, wherein the SiC bulk substrate is contacted with the Si supply gas and the C supply gas without etching.

19. The method according to claim 1, wherein during the performing (ii) the SiC bulk substrate is contacted with a reducing gas while the Si supply gas and the C supply gas are stopped and the temperature of the SiC bulk substrate is increased from the first temperature to a second temperature.

20. The method according to claim 1, wherein the increasing of the temperature in (ii) is performed in an atmosphere of only a reducing gas.

\* \* \* \* \*